(12) United States Patent
Torii et al.

(10) Patent No.: US 6,479,742 B2
(45) Date of Patent: Nov. 12, 2002

(54) AUDIO SYSTEM IN ELECTRONIC MUSICAL INSTRUMENT

(75) Inventors: Katsuhiko Torii, Hamamatsu (JP); Tadashi Yasuda, Hamamatsu (JP)

(73) Assignee: Kabushiki Kaisha Kawai Gakki Seisakusho, Shizuoka (JP)

(*) Notice: Subject to any disclaimer, the term of this patent is extended or adjusted under 35 U.S.C. 154(b) by 0 days.

(21) Appl. No.: 09/816,237

(22) Filed: Mar. 23, 2001

(65) Prior Publication Data

US 2001/0024505 A1 Sep. 27, 2001

(30) Foreign Application Priority Data

Mar. 27, 2000 (JP) .................................. 2000-086370
Jun. 13, 2000 (JP) .................................. 2000-177418

(51) Int. Cl.⁷ ............................................... G10H 3/06
(52) U.S. Cl. ........................... 84/724; 381/58; 381/61
(58) Field of Search .................... 381/123, 58, 61, 381/81; 84/724

(56) References Cited

U.S. PATENT DOCUMENTS

| | | | |
|---|---|---|---|
| 5,475,214 A | * 12/1995 | DeFranco et al. | 84/724 X |
| 5,542,000 A | * 7/1996 | Semba | 381/61 |
| 5,818,949 A | * 10/1998 | Deremer et al. | 381/172 |
| 6,153,822 A | * 11/2000 | Toba et al. | 84/724 |

FOREIGN PATENT DOCUMENTS

| | | |
|---|---|---|
| JP | 10097253 | 4/1998 |
| JP | 11237878 | 8/1999 |

* cited by examiner

Primary Examiner—Jeffrey Donels
(74) Attorney, Agent, or Firm—Christie, Parker & Hale, LLP

(57) ABSTRACT

The present invention provides an audio system in an electronic musical instrument which can determine the characteristics of a reproduced sound automatically or simply for matching with the environment.

An infrared ray emitter and an infrared ray receiver are mounted at the back side of the electronic musical element (such as an electronic piano). In case that the electronic musical instrument is placed adjacent to a wall, an infrared ray emitted from the infrared ray emitter is reflected on the wall and received by the infrared ray receiver. When the reflection of the infrared ray received by the infrared ray receiver exceeds a predetermined level, a CPU judges that the electronic musical instrument is located adjacent to the wall and transmits a coefficient indicative of a highpass filtering profile to a frequency characteristic adjusting circuit. The frequency characteristic adjusting circuit acts as a highpass filter and allows a DSP to release a signal output of which the low frequency component is successfully attenuated. Alternatively, a switching means is provided for determining the switching action depending on the environment where the electronic musical instrument is placed. The frequency characteristic of a reproduced sound can thus be controlled by the switching operation of the switching means.

6 Claims, 4 Drawing Sheets

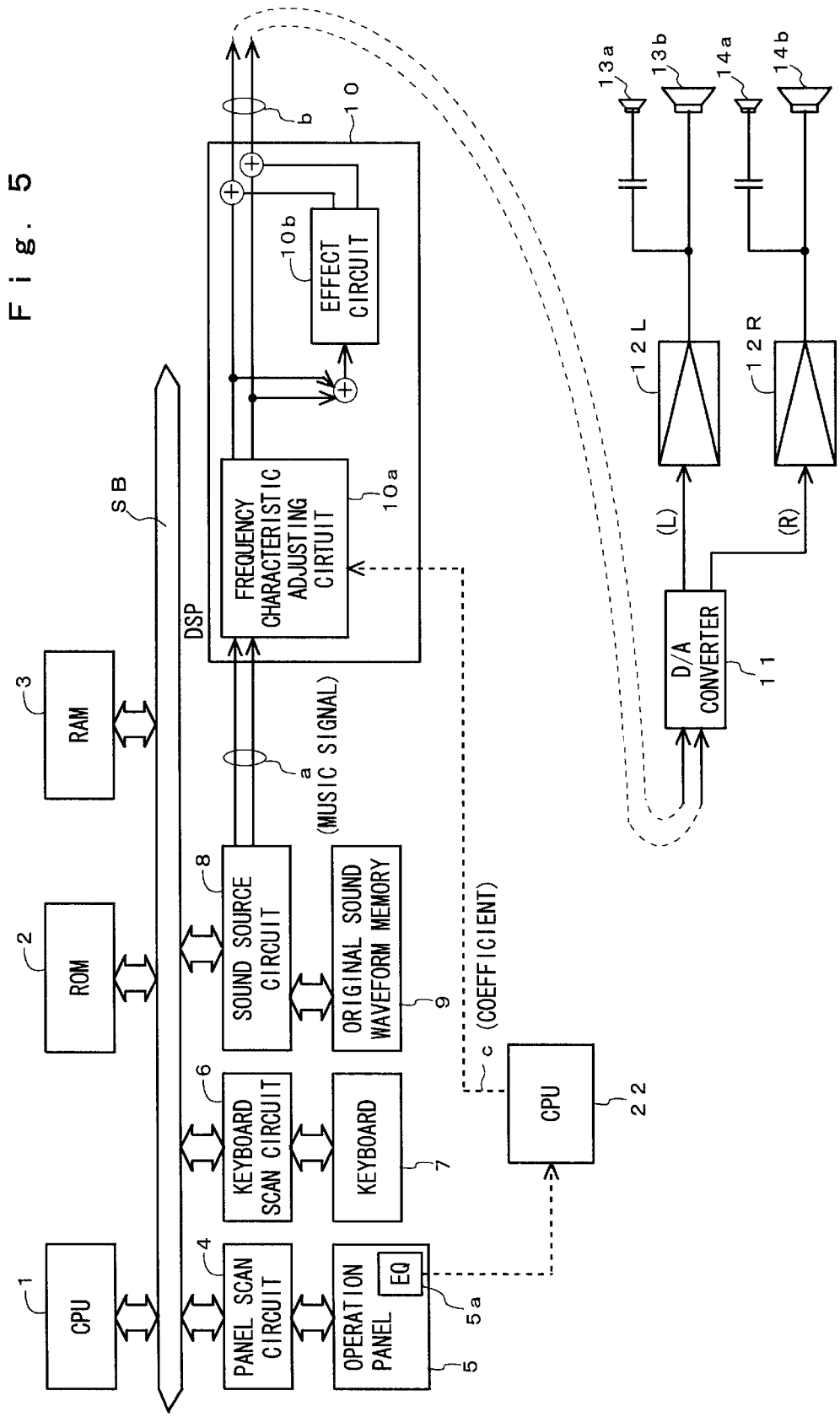

AUDIO SYSTEM IN ELECTRONIC MUSICAL INSTRUMENT

CROSS-REFERENCE TO RELATED APPLICATIONS

This application claims priority of Japanese patent applications numbers 2000-086370, and 2000-177478, filed Mar. 27, 2000, and Jun. 13, 2000, respectively.

BACKGROUND OF THE INVENTION

1. Field of the Invention

The present invention relates to an audio system in an electronic musical instrument which can produce an optimum quality of sound without asking the player for any troublesome adjustment regardless of the location of the electronic musical instrument.

2. Description of the Related Art

Electronic musical instruments (such as electronic pianos) of a particular type having a loudspeaker(s) with its face down or arranged to face in the rearward direction (in the opposite direction to the player) have been marketed. The latter type of the electronic musical instrument has the loudspeaker arranged facing opposite to the player for issuing an optimum quality of sound towards the audience. Hence, the electronic musical instruments of the latter type are favorably used for education in a school or playing on a stage.

When such a type of the electronic musical instrument is placed adjacent to the wall, its sound to the player may be degraded as compared with the placement far from the wall. More specifically, as the bass component of the sound is less directional, the bass component reflected on the wall may be emphasized and received by the player with a negative effect.

Some of the conventional electronic musical instruments of that type are equipped with tone control knobs. The tone control knob can be turned by the player so that the reproduced sound is favorable in the bass and treble level. In case that the electronic musical instrument is placed in a different location, its sound can be controlled to a desired quality of sound by the operation of the tone control knob.

It is yet troublesome for the player to carefully operate the tone control knob of the electronic musical instrument until a desired quality of sound is obtained. Such troublesome operation of the tone control knob is hated by most of the players.

SUMMARY OF THE INVENTION

It is thus an object of the present invention to provide an audio system in an electronic musical instrument which eliminates the above disadvantage of the prior art and can automatically adjust the reproduced sound to a desired characteristic or level at the location of the installation.

For achievement of the above object, an audio system in an electronic musical instrument having a loudspeaker(s) for reproducing a music sound is provided as a first feature of the present invention comprising: at least one switching means which is turned on and off depending on the environment where the electronic musical instrument is located; and a means for modifying the frequency characteristic of the music sound in response to the operation of the switching means.

According to the first feature of the present invention, the audio system of the present invention allows the player to simply turn on and off the switching means for reproducing sounds of an optimum quality under the conditions where the electronic musical instrument is placed.

As a second feature of the present invention, an audio system in an electronic musical instrument having a loudspeaker(s) for reproducing a music sound is provided comprising: an infrared ray emitter for emitting an infrared ray in the rearward direction of the electronic musical instrument; an infrared ray receiver for receiving reflection of the infrared ray; and a means for modifying the frequency characteristic of the music sound when the reflection of the infrared ray received by the infrared ray receiver exceeds a predetermined level so that an optimum quality of the music sound can be issued in the frontward direction of the electronic musical instrument.

According to the second feature of the present invention, when the electronic musical instrument is placed adjacent to the wall, its location is automatically detected by the infrared ray receiver receiving the reflection of an infrared ray emitted from the infrared ray emitter. As the location of the electronic musical instrument adjacent to the wall is detected, the frequency characteristic of a music sound can automatically be modified to a corresponding one thus allowing an optimum quality of the music sound to be perceived at the front side of the electronic musical instrument.

BRIEF DESCRIPTION OF THE DRAWINGS

FIG. 5 is a block diagram showing a second embodiment of the present invention.

DETAILED DESCRIPTION OF THE PREFERRED EMBODIMENTS

Figure 1:
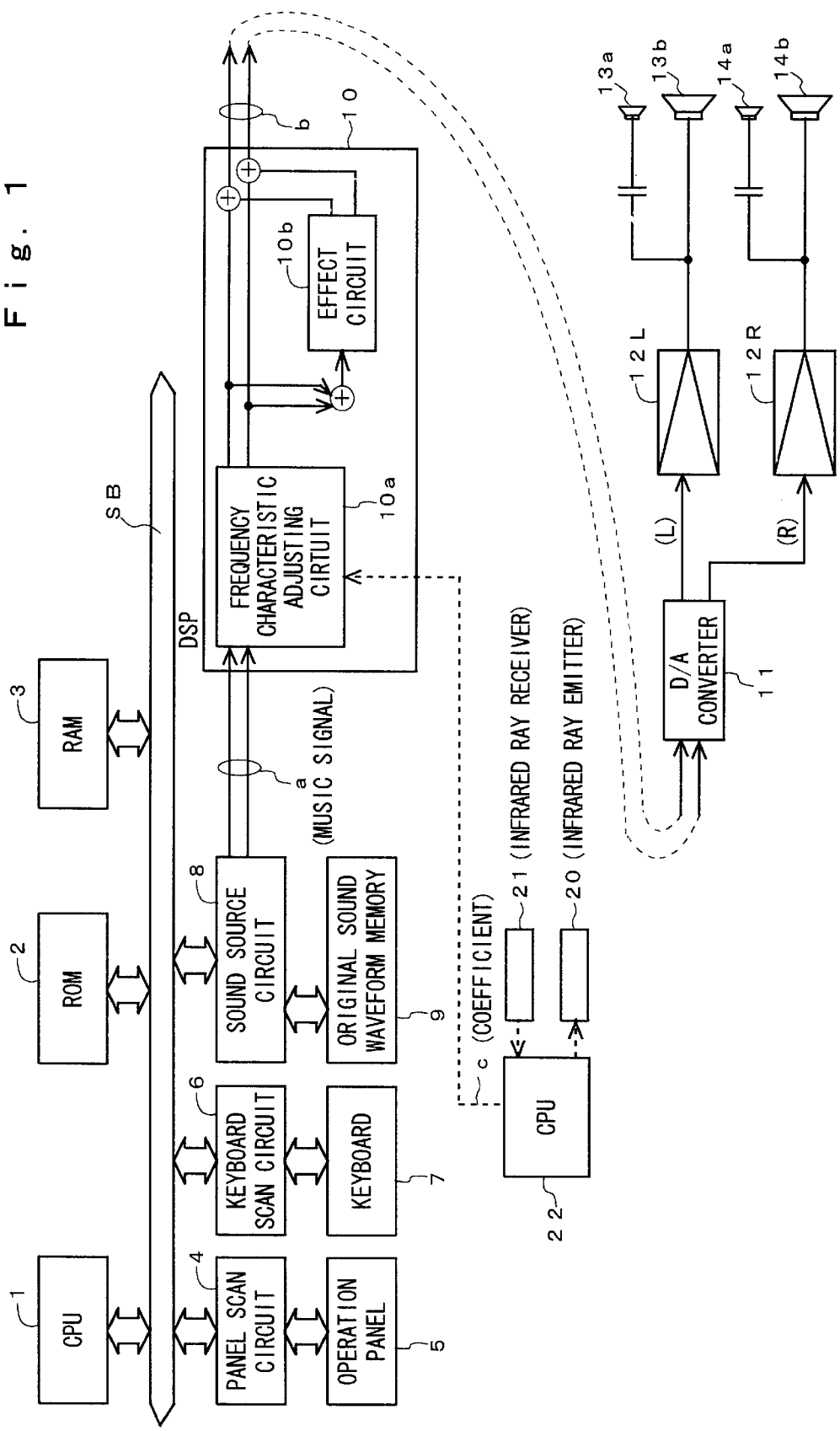
FIG. 1 is a block diagram of an electronic musical instrument showing a first embodiment of the present invention.

The present invention will be described in more detail referring to the relevant drawings. FIG. 1 is a block diagram showing one embodiment in an electronic musical instrument (e.g. an electronic piano) according to the present invention.

As shown, a central processing unit (CPU) 1 controls the operation of each component with the use of a control program stored in a program memory of a ROM 2. The ROM 2 also holds a variety of specific data handled by the CPU 1 in addition to the control program for controlling the operation of each component of the electronic musical instrument. The control program and the specific data can be accessed via a system bus SB by the CPU 1. A RAM 3 holds status data and saves a working area for the CPU 1. The RAM 3 also contains various registers and flags for controlling the action of the electronic musical instrument and can thus be accessed via the system bus SB by the CPU 1.

An operation panel 5 has a group of switches, including a power switch and a tone control switch, and a display(s) for displaying given information. A panel scan circuit 4 examines the set/reset state of each switch mounted on the operation panel 5 and when finding the turn-on state of a switch, transfers the state of the switch as a detection signal to the CPU 1.

A keyboard 7 comprises an array of keys and an array of switches for opening and closing linked with the keys touched. A keyboard scan circuit 6 examines the on or off state of each key switch, generates from a signal of the on or off state a touch data indicative of the strength (velocity) of the key touch action, and releases the on or off state signal and its corresponding key number. The on or off state signal, the key number, and the touch data are transferred via the system bus SB to the CPU 1.

In response to the signal from the CPU 1, a sound source circuit 8 reads out a waveform of the original sound from a original sound waveform memory 9 and multiplies the waveform by an envelope to develop a music signal (a) which is transferred to a DSP (digital signal processor) 10. The DSP 10 includes a frequency characteristic adjusting circuit 10a as a primary component according to the present invention and an effect circuit 10b. The effect circuit 10b generates various audio effects including reverb and chorus. The output signal or a music signal (b) released from the DSP 10 is converted into an analog signal by a D/A converter 11. The analog signal is transferred to a couple of main amplifiers 12L and 12R for amplification. The analog audio signal amplified by the main amplifiers 12L and 12R is then emitted as sounds from treble loudspeakers 13a, 14a and bass loudspeakers 13b, 14b.

There are also provided a light emitter 20 such as an infrared ray emitter and a light receiver 21 such as an infrared ray receiver which both are mounted to the back of the electronic musical instrument, and a CPU 22 for controlling the operations of the infrared ray emitter 20 and the infrared ray receiver 21. When the infrared ray receiver 21 receives an infrared ray, the CPU 22 feeds the frequency characteristic adjusting circuit 10a in the DCP 10 with a coefficient (c) for using in installation adjacent to the wall or a signal for selection of the coefficient (c).

Figure 2:
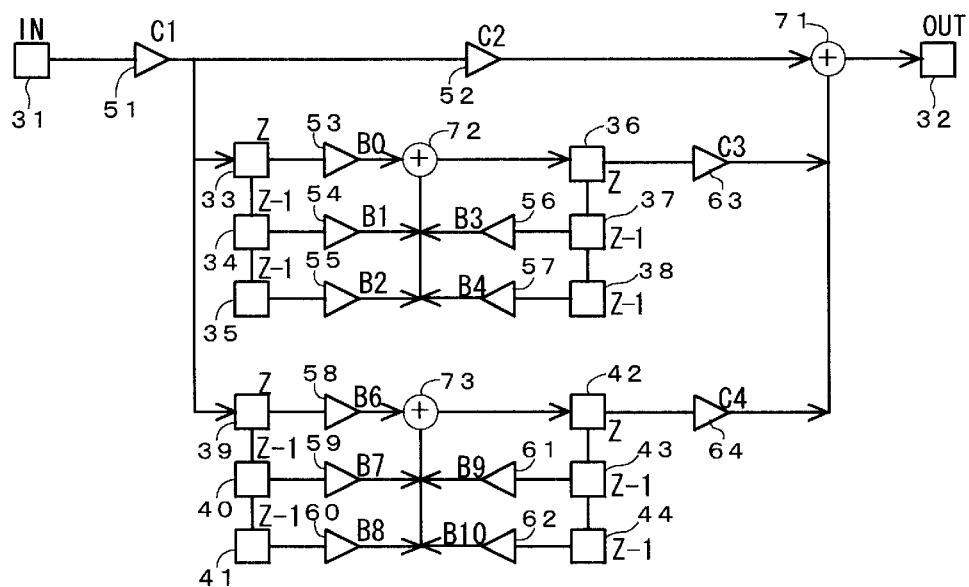
FIG. 2 is a block diagram of a frequency characteristic adjusting circuit shown in FIG. 1.

FIG. 2 is a block diagram showing an arrangement of the frequency characteristic adjusting circuit 10a. While the frequency characteristic adjusting circuit 10a is provided in this embodiment, it may be replaced by a tone control circuit.

The frequency characteristic adjusting circuit 10a is connected as shown and comprises buffers 31 to 44, multipliers 51 to 64, and adders 71 to 73. The frequency characteristic adjusting circuit 10a shown in FIG. 2 consists mainly of two element sections. The first element includes the buffers 33 to 38, the multipliers 53 to 57 and 63, and the adder 72. The second element includes the buffers 39 to 44, the multipliers 58 to 62 and 64, and the adder 73. The frequency characteristic adjusting circuit 10a serves as an equalizer or a secondary digital filter.

In the first element, the multiplier 53 multiplies the input signal from the buffer 33 by a factor B0 and then transmits a product signal to the adder 72. The multiplier 54 multiplies by a factor B1 a delayed signal which is produced by the buffer 34 delaying the input signal by one sampling period. The multiplier 55 multiplies by a factor B2 a more delayed signal which is produced by the buffer 35 delaying the delayed signal again by one sampling period. The multiplier 56 multiplies by a factor B3 a sum signal which is produced by the adder 72 and delayed one sampling period by the buffer 37. The multiplier 57 multiplies by a factor B4 a delayed signal which is produced by further delaying the sum signal one sampling period by the buffer 38. The outputs of the multipliers 53 to 57 are then summed up by the adder 72, subjected to multiplication by a factor c3 in the multiplier 63, and then transmitted to the adder 71.

The second element is substantially identical in the construction to the first element, except that its multipliers 58 to 62 employ factors B6 to B10 respectively which are different from the factors B0 to B4 of the corresponding multipliers 53 to 57, and will be explained in no more detail. The symbol "z-1" means that the buffer delays the input signal by one sampling period.

Accordingly, the frequency characteristic adjusting circuit 10a can act as a highpass filter for attenuating the frequencies of the input signal, e.g. by 6 dB, through selectively determining the factors B0 to B4 and B6 to B10.

The CPU 22 shown in FIG. 1 has at least two, first and second, tables carrying the factors B0 to B4 and B6 to B10. The first table is designed with the factors B0 to B4 and B6 to B10 for reproducing sounds of high quality when the electronic musical instrument is located far from the walls, for example, at the center of the room. The second table is designed with the factors B0 to B4 and B6 to B10 for reproducing sounds of high quality when the electronic musical instrument is located directly on or. adjacent to the wall. In operation, the CPU 22 selects the first or second table depending on the state of a received infrared ray at the infrared ray receiver 21 and supplies the frequency characteristic adjusting circuit 10a with a desired set of the factors B0 to B4 and B6 to B10 as the coefficient (c). More particularly, the CPU 22 selects the first table when the received infrared ray at the infrared ray receiver 21 is smaller than a predetermined level and the second table when not smaller than the predetermined level.

Figure 3:
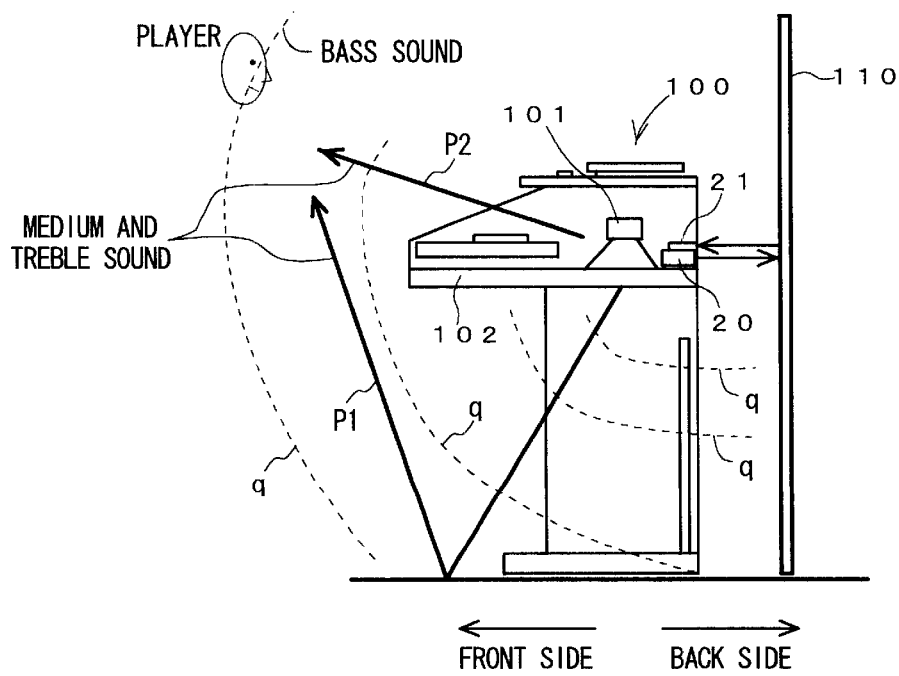
FIG. 3 is an explanatory view showing a modification of the embodiment.

The operation of this embodiment will now be explained by way of example. FIG. 3 illustrates an electronic musical instrument 100 with a loudspeaker 101 mounted with its face down on a platform 102 thereof, which is equipped with the system of the present invention. As shown, the infrared ray emitter 20 and the infrared ray receiver 21 are mounted at the back side or at the side opposite to the player, preferably close to the loudspeaker 101.

As the electronic musical instrument 100 is located adjacent to the wall 110, highly directional medium and treble sounds emitted from the loudspeaker 101 is reflected on the floor and then received or directly received by the player seated at the front, as denoted by the real lines P1 and P2, and hence will hardly be influenced by the wall 110. However, since bass sounds are less directional but diffusive, their reflections on the wall 110 may also be received by the player as denoted by the dotted lines q. In other words, the characteristics of bass sound emitted from the electronic musical instrument 100 which is located adjacent to the wall 110 will be different from those of an electronic musical instrument located far from the wall 110. As the bass sounds emitted from the electronic musical instrument 100 adjacent to the wall 110 are emphasized by their reflections on the wall 110, their quality will be declined.

In the electronic musical instrument 100 of this embodiment, the infrared ray emitter 20 and the infrared ray receiver 21 are mounted at the back side. When the electronic musical instrument 100 is located adjacent to the wall 110, the infrared ray emitted from the infrared ray emitter 20 is reflected on the wall 110 and then received by the infrared ray receiver 21. As the infrared ray received at the infrared ray receiver 21 is higher than the predetermined or threshold level, the CPU 22 (FIG. 1) automatically acknowledges that the electronic musical instrument 100 is located adjacent to the wall 100.

As described previously, the CPU 22 holds the tables for determining an optimum set of the factors B0 to B4 and B6 to B10 of the frequency characteristic adjusting circuit 10a in a memory not shown. When acknowledging from a detection signal of the infrared ray receiver 21 that the electronic musical instrument 100 is located. adjacent to the wall 100, the CPU 22 reads out an optimum set of the factors B0 to B4 and B6 to B10 from its unshown memory and transmits them to the frequency characteristic adjusting circuit 10a. The frequency characteristic adjusting circuit 10a utilizes the factors B0 to B4 and B6 to B10 received from the CPU 22 to decline the bass sound to a proper level. This permits the DSP 10 to generate an optimum level of the audio signal (b) for the electronic musical instrument 100 located adjacent to the wall 100.

Figure 4:
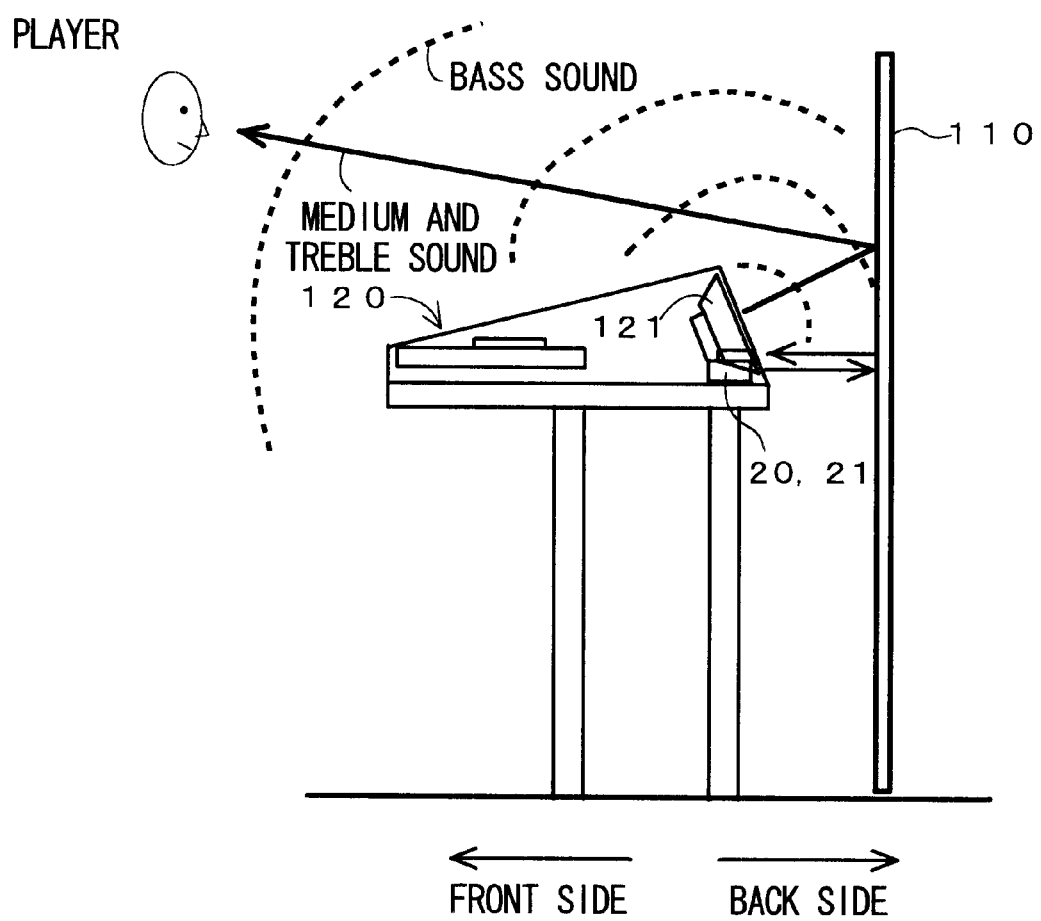
FIG. 4 is an explanatory view showing another modification of the embodiment.

Another example will also be explained referring to FIG. 4. FIG. 4 illustrates an electronic musical instrument 120 having a loudspeaker 121 mounted to face the back side and equipped with the system of the present invention. As the electronic musical instrument 120 has the loudspeaker 121 mounted to face the back side, it may primarily be used for education in a school or playing on a stage.

In this example, the infrared ray emitter 20 and the infrared ray receiver 21 are also mounted at the back side, preferably close to the loudspeaker 121. When the electronic musical instrument 120 is placed directly on or adjacent to the wall 110, its medium and treble sounds as well as bass sounds are reflected by the wall 110 and their quality will be declined.

Accordingly, with the electronic musical instrument 120 placed directly on or adjacent to the wall 110, the factors B0 to B4 and B6 to B10 in the frequency characteristic adjusting circuit 10a have been calculated to have an optimum set for reproducing the best sounds and saved in an unshown memory of the CPU 22. Upon being informed from the operation of the infrared ray emitter 20 and. the infrared ray receiver 21 that the electronic musical instrument 120 is placed directly on or adjacent to the wall 110, the CPU 22 reads out the optimum set of the factors B0 to B4 and B6 to B10 from its memory and transferred them to the frequency characteristic adjusting circuit 10a. This allows the DSP 10 to generate an optimum level of the output signal (b) carrying a medium and treble sound component and a bass sound component at a desired ratio.

As described, this embodiment has the infrared ray emitter 20 and the infrared ray receiver 21 to be mounted at the back side or the side opposite to the player for ease of the detection of infrared ray emitted from the infrared ray emitter 20 and received by the infrared. ray receiver 21. This permits the electronic musical instrument to be automatically detected whether or not its location is adjacent to the wall. Upon detecting that the electronic musical instrument is adjacent to the wall, the CPU 22 determines and transmits an optimum set of the factors B0 to B4 and B6 to B10 to the frequency characteristic adjusting circuit 10a. Accordingly, the reproduction of sounds will systematically be carried out in an optimum condition without any control of the instrument by the player. The operation for detecting the location by the infrared ray emitter 20 and the infrared ray receiver 21 may instantly be conducted, but not limited to, once whenever the electronic musical instrument is powered on.

While the CPU 22 in the embodiment judges from the two levels, both sides of the threshold, of the received infrared ray at the infrared ray receiver 21, its judging operation is of no limitations. Using two or more thresholds, the judgment may be made from three or more levels for determining an optimum set of the factors B0 to B4 and B6 and B10 used in the frequency characteristic adjusting circuit 10a. Accordingly, the frequency characteristic of the frequency characteristic adjusting circuit 10a can favorably be modified corresponding to the distance of the electronic musical instrument from the wall.

A second embodiment of the present invention will now be described referring to FIG. 5. This embodiment is characterized by one or more switching means operated depending on the environment where an electronic musical is placed or more particularly by an EQ (equalizer) switch 5a mounted on the operation panel. Otherwise, like components in FIG. 5 are denoted by like numerals as those shown in FIG. 1.

The EQ switch 5a is connected to the CPU 22. When the EQ switch 5a remains not pressed down or at its off position, the CPU 22 selects the first table. When the EQ switch 5a is depressed and turned on, the CPU 22 then selects the second table.

As described previously, the first table provides a set of the factors B0 to B4 and B6 to B10 for reproducing optimum quality sounds when the electronic musical instrument is placed far from the wall, for example, at the center of the room. Alternatively, the second table provides another set of the factors B0 to B4 and B6 to B10 for reproducing optimum quality sounds when the electronic musical instrument is placed directly on or adjacent to the wall.

Accordingly, as the EQ switch 5a remains turned off in the electronic musical instrument placed far from the wall, for example, at the center of the room, the CPU 22 reads out an optimum set of the factors B0 to B4 and B6 to B10 from the first table and transmits them to the frequency characteristic adjusting circuit 10a. Once the EQ switch 5a is depressed and turned on in the electronic musical instrument which is placed directly on or adjacent to the wall, the CPU 22 reads out an optimum set of the factors B0 to B4 and B6 to B10 from the second table:and transmits them to the frequency characteristic adjusting circuit 10a.

As a result, the switching on and off of the EQ switch 5a allows the player to enjoy the reproduction of quality sounds regardless of the location of the electronic musical instrument either far from or adjacent to the wall. While the CPU 22 in this embodiment is provided separately of the CPU 1, it may be omitted with the function of the CPU 1 expanded to have the function of the CPU 22. The same is applicable to the embodiment shown in FIG. 1.

Alternatively, the EQ switch 5a may be modified to have three or more switching positions. For example, the EQ switch 5a is provided of a toggle type for switching between three different positions for the center-of-room application, the close-to-wall application, and the flat response application. Also, three or more of the EQ switches may be provided for assigning their respective functions. It is understood that when the EQ switches for those actions are provided in an electronic musical instrument, the infrared ray emitter 20 and the infrared ray receiver 21 shown in FIGS. 3 and 4 can be eliminated.

This embodiment permits one or more of the EQ switches mounted on the operational panel to be selectively turned on and off so that the player can enjoy reproducing quality sounds on the electronic musical instrument which is placed in any location, either adjacent to the wall or at the center, in the room.

While the tables of the factors B0 to B4 and B6 to B10 used for multiplication in the frequency characteristic adjusting circuit 10a are saved in the CPU 22, they may be carried in the DSP 10 and can be accessed by the CPU 1 or the CPU 22 sending a command signal (c) for selection of a desired table for either the close-to-wall application or the center-of-room application.

As apparent from the above description, the system of the present invention allows the player to simply turn on and off the switches for reproducing sounds of an optimum quality under the conditions where the electronic musical instrument is placed.

When the location of the electronic musical instrument relative to the-walls is automatically detected, its information is used to systematically determine the frequency characteristic of an audio signal. Accordingly, even if the electronic musical instrument is located adjacent to the wall, it can produce sounds of an optimum quality without asking the player for any adjustment.

Also, since the infrared ray emitter and the infrared ray receiver are mounted close to the loudspeaker, they can judge more accurately whether or not the electronic musical instrument is located adjacent to the wall. As a result, the negative effect of the wall upon the electronic musical instrument can be corrected more precisely.

What is claimed is:

1. An audio system in an electronic musical instrument having a loudspeaker for reproducing a music sound, comprising:
   at least one switching means which is turned on and off depending on the environment where the electronic musical instrument is located; and
   means for modifying the frequency characteristic of the music sound in response to the operation of the switching means, wherein the at least one switching means is switched depending on whether or not the electronic musical instrument is located adjacent to a wall.

2. An audio system in an electronic musical instrument having a loudspeaker for reproducing a music sound, comprising:
   an infrared ray emitter for emitting an infrared ray in the rearward direction of the electronic musical instrument;
   an infrared ray receiver for receiving reflection of the infrared ray; and
   means for modifying the frequency characteristic of the music sound so that an optimum quality of the music sound can be issued in the frontward direction of the electronic musical instrument when the reflection of the infrared ray received by the infrared ray receiver exceeds a predetermined level, wherein the loudspeaker is arranged to face in one of the downward direction and the rearward direction, and both the infrared ray emitter and the infrared ray receiver are mounted adjacent to the loudspeaker.

3. An audio system in an electronic music instrument having a loudspeaker(s) for reproducing a music sound, comprising:
   at least one switching means which is turned on and off depending on the environment where the electronic musical instrument is located; and
   means for modifying the frequency characteristic of the music sound in response to the operation of the switching means wherein the means for modifying the frequency response of the music sound includes:
   means for transferring one of a coefficient and a command for attenuating at least a bass component of the music sound; and
   means for modifying the frequency characteristic of the music sound in response to one of the coefficient and the command, and wherein the loudspeaker is arranged to face in one of the downward direction and the rearward direction and both the infrared ray emitter and the infrared ray receiver are mounted adjacent to the loudspeaker.

4. An audio system in an electronic music instrument according to claim 2, wherein the means for modifying the frequency response of the music sound includes:
   means for transferring one of a coefficient and a command for attenuating at least a bass component of the music sound, and
   means for modifying the frequency characteristic of the music sound in response to one of the coefficient and the command.

5. An audio system in an electronic musical instrument having a loudspeaker for reproducing a music sound, comprising:
   at least one switch which is turned on and off depending on the environment where the electronic musical instrument is located; and
   a frequency characteristic adjusting circuit for modifying the frequency characteristic of the music sound. in response to the operation of the at least one switch, wherein the at least one switch is switched depending on whether or not the electronic musical instrument is located adjacent to a wall.

6. An audio system in an electronic musical instrument having a loudspeaker, comprising:
   an infrared ray emitter for emitting an infrared ray in the rearward direction of the electronic musical instrument;
   an infrared ray receiver for receiving reflection of the infrared ray; and
   a frequency characteristic adjusting circuit for modifying the frequency characteristic of the music sound so that an optimum quality of the music sound can be issued in the frontward direction of the electronic musical instrument when the reflection of the infrared ray received by the infrared ray receiver exceeds a predetermined level, wherein the loudspeaker is arranged to face in one of the downward direction and the rearward direction, and both the infrared ray emitter and the infrared ray receiver are mounted adjacent to the loudspeaker.

* * * * *